United States Patent
Pratt et al.

(10) Patent No.: US 7,079,117 B2
(45) Date of Patent: Jul. 18, 2006

(54) ANALOG TO DIGITAL CONVERTER CONTROLLER

(75) Inventors: Susan M. Pratt, Limerick (IE); Thomas P. Kearney, Cork (IE); Jose M. Vinau, Newbury (GB); Yukihisa Handa, Tokyo (JP)

(73) Assignee: Analog Devices, Inc., Norwood, MA (US)

( * ) Notice: Subject to any disclaimer, the term of this patent is extended or adjusted under 35 U.S.C. 154(b) by 339 days.

(21) Appl. No.: 10/439,209

(22) Filed: May 15, 2003

(65) Prior Publication Data

US 2004/0227735 A1 Nov. 18, 2004

(51) Int. Cl.
*G09G 5/00* (2006.01)

(52) U.S. Cl. .................. 345/173; 345/174; 345/179

(58) Field of Classification Search ............... 345/173, 345/174, 179; 178/18, 19, 20, 18.01, 18.03, 178/19.01; 340/712; 705/7, 22; 702/22, 702/77
See application file for complete search history.

(56) References Cited

U.S. PATENT DOCUMENTS

| 4,707,845 A | * | 11/1987 | Krein et al. ............. 178/20.01 |
|---|---|---|---|
| 5,053,757 A | * | 10/1991 | Meadows .................... 345/173 |
| 5,079,624 A | * | 1/1992 | Sasuga et al. .............. 358/530 |
| 5,260,697 A | * | 11/1993 | Barrett et al. ............... 345/173 |
| 5,272,470 A | * | 12/1993 | Zetts .......................... 345/173 |
| 5,895,906 A | * | 4/1999 | Danielson et al. ..... 235/462.45 |
| RE38,286 E | * | 10/2003 | Flowers ................... 178/18.01 |
| 6,738,048 B1 | * | 5/2004 | Rundel ....................... 345/173 |
| 6,789,030 B1 | * | 9/2004 | Coyle et al. ................... 702/77 |
| 2002/0089491 A1 | | 7/2002 | Willig ........................ 345/173 |
| 2002/0129300 A1 | * | 9/2002 | Floyd et al. .................. 714/39 |
| 2004/0064351 A1 | * | 4/2004 | Mikurak ........................ 705/7 |
| 2005/0156559 A1 | * | 7/2005 | Thibedeau et al. ......... 320/106 |
| 2005/0234778 A1 | * | 10/2005 | Sperduti et al. .............. 705/22 |

OTHER PUBLICATIONS

Wolfson Microelectronic Ltd, Multimedia AC'97 Codec with Integrated Touch Screen Controller, Advance Information, Oct. 2002, Rev 3.6, pp. 1-52.

* cited by examiner

*Primary Examiner*—Vijay Shankar
*Assistant Examiner*—Prabodh Dharia
(74) *Attorney, Agent, or Firm*—Bromberg & Sunstein LLP (57) ABSTRACT

A touch screen controller has a converter that digitizes analog input as a function of an interference signal generated by an underlying touch screen device. To that end, the touch screen controller includes a set of inputs for receiving the noted interference signal from the touch screen device. The set of inputs also receives analog data from the touch screen device. The above noted converter, which is operatively coupled with the set of inputs, is capable of digitizing the analog data received from the touch screen device as a function of the interference signal.

18 Claims, 6 Drawing Sheets

ANALOG TO DIGITAL CONVERTER CONTROLLER

FIELD OF THE INVENTION

The invention generally relates to analog to digital converters and, more particularly, the invention relates to devices for controlling analog to digital converters.

BACKGROUND OF THE INVENTION

Touch is one of the most intuitive human actions. Modern technology has capitalized on this fact by developing various products that respond to the human touch. For example, people can control different types electronic devices by contacting accompanying touch screen devices with either their finger or some other device (e.g., a stylus). Among other things, touch screen devices are used in automatic teller machines ("ATMs") to permit a cash withdrawal, pen and tablet devices to enter data, and credit card signature devices to receive a customer's signature.

Many conventional touch screen devices have a display device, and a sensing arrangement that senses the coordinates of the point of contact. More specifically, contact at a specific location on the face of the display device generates a corresponding analog signal. This analog signal typically is sampled and converted (by an analog-to-digital converter) into a digital signal that is used by an electronic module (e.g., a microprocessor or microcontroller) to determine the coordinates of the point of contact.

Undesirably, however, the above noted analog signal can be distorted by signals generated by the display device. For example, the horizontal refresh signal, which can be produced many times per second (e.g., 24 to 30 times per second), commonly has the unintended effect of corrupting the analog signal. Consequently, if the analog signal is corrupted, then the coordinate data calculated from such analog signal can be corrupted. This corrupted data in turn adversely impacts the operation of the underlying system relying upon the touch screen device.

SUMMARY OF THE INVENTION

In accordance with one aspect of the invention, a touch screen controller has a converter that digitizes analog input as a function of an interference signal generated by an underlying touch screen device. To that end, the touch screen controller includes a set of inputs for receiving the noted interference signal from the touch screen device. The set of inputs also receives analog data from the touch screen device. The above noted converter, which is operatively coupled with the set of inputs, is capable of digitizing the analog data received from the touch screen device as a function of the interference signal.

The interference signal typically is cyclical and thus, has an off cycle and an on cycle. The touch screen controller also thus may have a disable module capable of preventing the converter from digitizing at some time during the on cycle of the interference signal. The controller also may have a delay module for preventing the converter from digitizing for a selected delay period after the beginning of the off cycle of the interference signal.

In some embodiments, the converter has an acquisition stage for acquiring the analog data, and a conversion stage for digitizing the acquired analog data. The converter is capable of digitizing given acquired data received during the on cycle of the interference signal. To ensure appropriate results, the given acquired data is acquired during the off cycle of the interference signal.

In other embodiments, the conversion stage is prevented from digitizing at some time during the on cycle of the interference signal. In still other embodiments, the acquisition stage is disabled as a function of the interference signal.

Among other things, the interference signal may be capable of distorting the data received from the touch screen device. For example, the interference signal may be a display device refresh signal. Moreover, the touch screen device may be any type of display device known in the art, such as a liquid crystal display device or a cathode ray tube display device.

In accordance with another aspect of the invention, a controller substantially prevents an analog-to-digital converter from converting analog data when an interfering signal is in a state that can corrupt the analog data to be converted. To that end, the controller for has an input for receiving an interference signal, and logic (operatively coupled with the input) for producing a control signal that is a function of the interference signal. The controller also has an output for forwarding the control signal to the analog-to-digital converter. The analog-to-digital converter digitizes analog signals as a function of the control signal.

In some embodiments, the controller includes an internal analog-to-digital converter. Accordingly, the output is coupled with the internal analog-to-digital converter to ensure that the control signal controls the internal analog-to-digital converter. Moreover, the controller may prevent the internal analog-to-digital converter from digitizing for a selected delay period after the beginning of an off cycle of the interference signal. In other embodiments, the control signal prevents the internal analog-to-digital converter from digitizing at some time during the on cycle of the interference signal.

In accordance with another aspect of the invention, a touch screen system has a display device, and a set of inputs for receiving 1) an interference signal from the touch screen device, and 2) analog data from the touch screen device. The system also has a converter operatively coupled with the set of inputs. The converter is capable of digitizing the analog data received from the touch screen device as a function of the interference signal.

Some embodiments of the invention may be implemented at least in part as a computer program product having a computer usable medium with computer readable program code thereon. The computer readable code may be read and utilized by a computer system in accordance with conventional processes

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a touch screen controller processes an analog signal (hereinafter, "input analog signal") produced by a touch screen device in a manner that minimizes the potentially adverse impact of a known interference signal (e.g., a horizontal refresh signal). To that end, the controller monitors the interference signal and, based upon the timing of the interference signal, digitizes portions of the input analog signal that are not significantly affected by the interference signal. Details of illustrative embodiments are discussed below.

Figure 1:
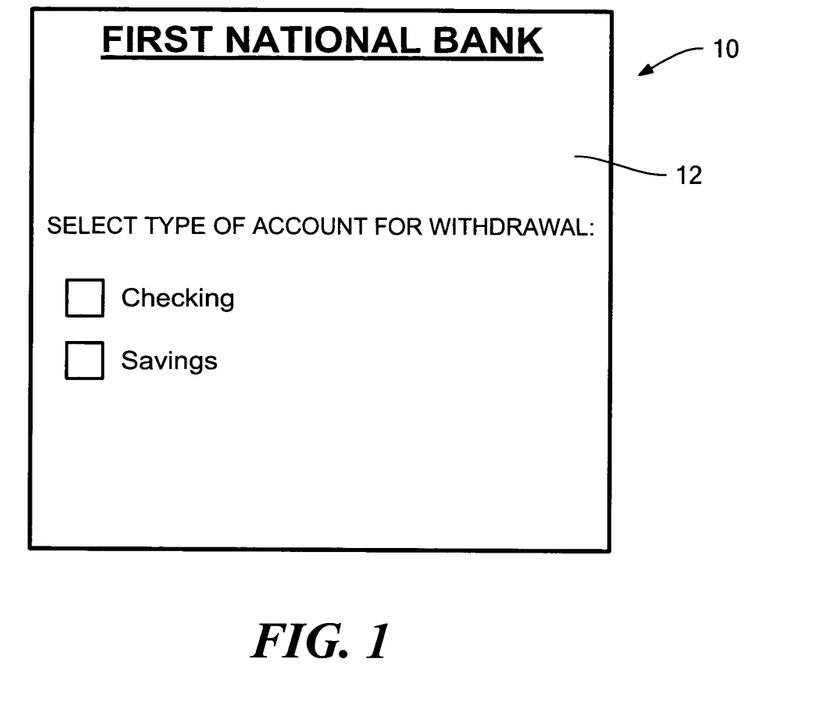
FIG. 1 schematically shows an exemplary touch screen system that may be configured in accordance with illustrative embodiments of the invention.

FIG. 1 schematically shows an exemplary resistive touch screen system 10 that may be configured in accordance with illustrative embodiments of the invention. The touch screen system 10 shown is part of an automatic teller machine ("ATM"), which enables people to withdraw money from a financial institution. The system 10 includes a display device 12 for displaying graphical indicia, and a resistive touch screen apparatus (see FIGS. 2–7, discussed in greater detail below). The display device 12 may be any type of conventional display device known in the art, such as a liquid crystal display ("LCD") device or a cathode ray tube ("CRT") display device.

In simplified terms, resistive touch screen systems provide their basic functionality by stacking a pair of planar sheets upon the screen of a display device 12, and calculating resistance values at the sheet edges when the display screen is touched. It should be noted, however, that some embodiments may apply to other types of touch screen systems. For example, some embodiments may apply to capacitive touch screen systems. Accordingly, discussion of a resistive touch screen system is exemplary and not intended to limit all embodiments of the invention.

Figure 2:
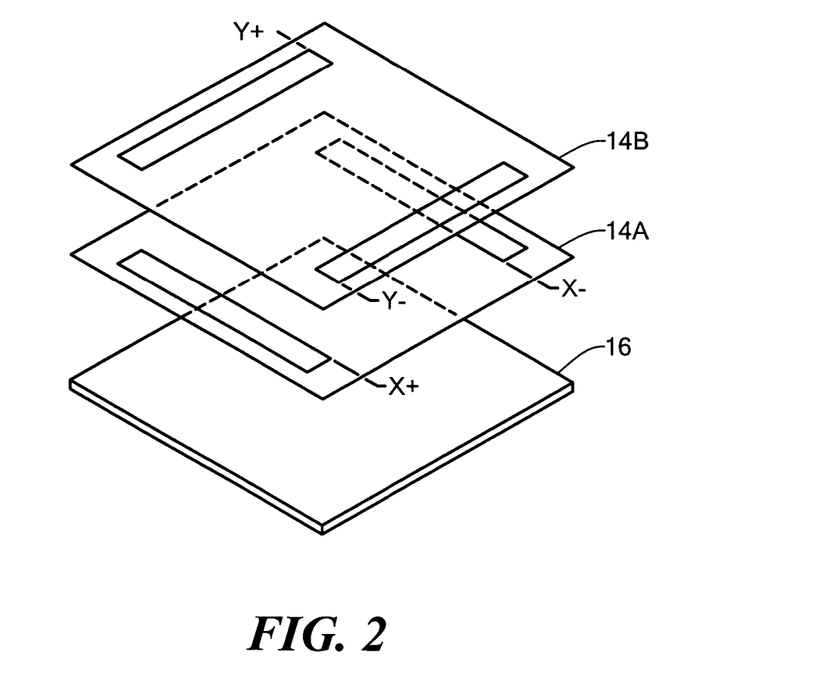
FIG. 2 schematically shows an exploded view of a touch screen that may be configured in accordance with illustrative embodiments of the invention.

FIG. 2 schematically shows the two sheets 14A and 14B and display device screen 16 of a conventional resistive touch control system. Each sheet 14A and 14B illustratively has a transparent, resistive coating, and a pair of conductive electrodes at its edges. In particular, one sheet 14A (the "X-plane sheet") has two electrodes on its top side, shown schematically as X+ and X, while the other sheet 14B (the "Y-plane sheet") correspondingly has two electrodes on its bottom side, shown schematically as Y+ and Y−.

As known by those skilled in the art, when the system face is touched, the electrodes X+, X−, Y+, and Y− and resistive coating cooperate to produce analog signals representing the coordinates of contact. Circuitry digitizes these analog signals to determine the coordinate information. In accordance with illustrative embodiments of the invention (as noted above), the touch control system 10 prevents this circuitry from digitizing these analog signals when a known interference signal is produced by the display device 12. The known interference signal may be any signal produced by the display device 12, such as the horizontal refresh signal (LCD HYSNC signal) or other control signal.

Figure 3:
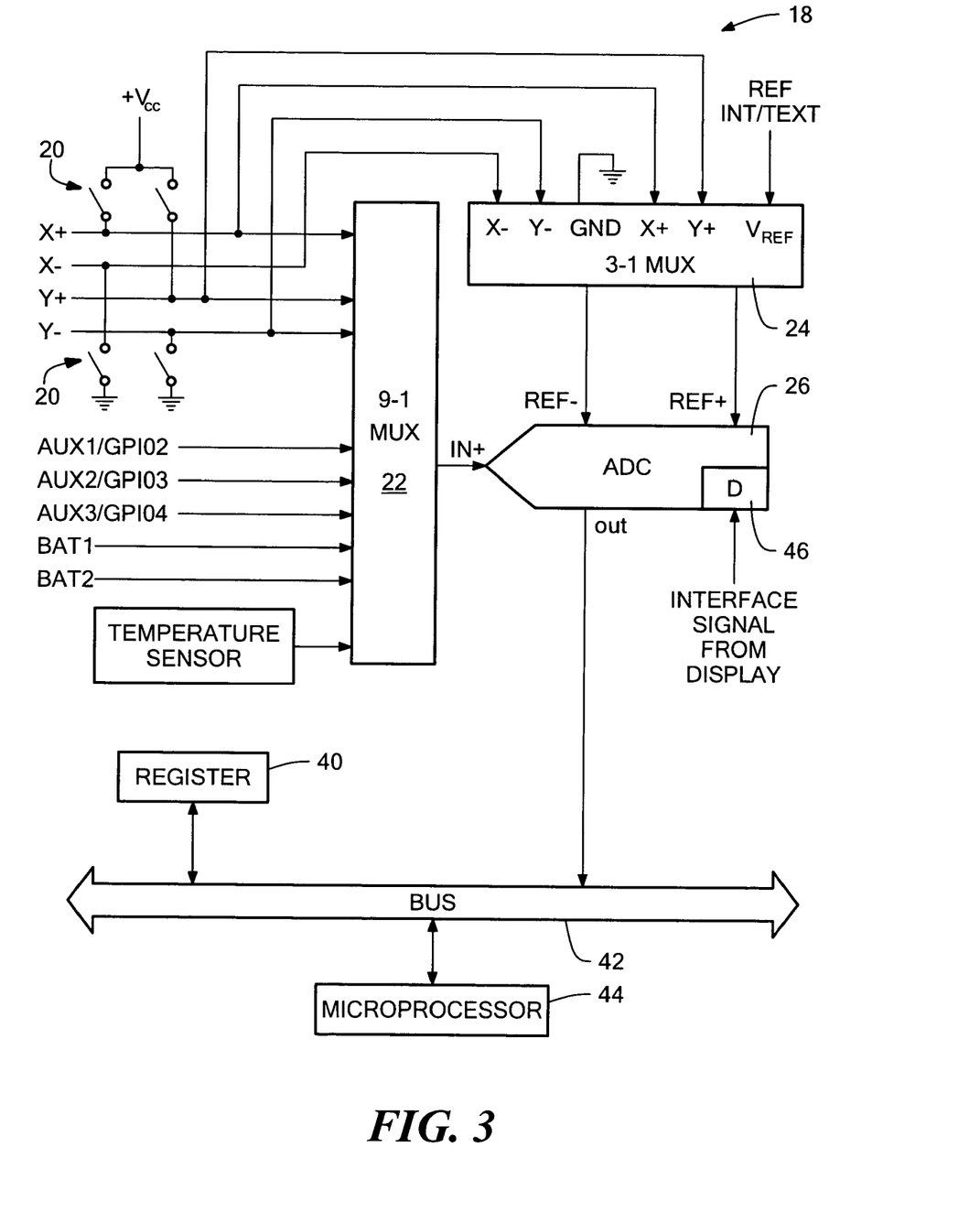
FIG. 3 schematically shows an electrical diagram of a touch screen controller that may be used to control the screen shown in FIG. 2.

FIG. 3 schematically shows an electrical diagram of a touch screen controller 18 configured in accordance with illustrative embodiments. Among other things, the controller 18 digitizes input analog signals received (via leads) from both the X-plane sheet electrodes X+ and X− and the Y-plane sheet electrodes Y+ and Y−. To that end, the controller 18 includes a set of switches 20 that selectively couple the four leads with a 9-1 multiplexer 22 and a 3-1 multiplexer 24, and an analog-to-digital converter 26 coupled with both multiplexers 22 and 24. In addition to the analog signals from the electrodes X+, X−, Y+, and Y−, the 9-1 multiplexer 22 also may couple battery signals, temperature signals, or other analog signals with the analog-to-digital converter 26. In contrast, the 3-1 multiplexer 24 multiplexes reference signals into the analog-to-digital converter 26.

In illustrative embodiments, the analog-to-digital converter 26 is a track and hold successive approximation register ("SAR") analog-to-digital converter. For example, the analog-to-digital converter 26 may be an AD7843 touch screen digitizer, distributed by Analog Devices, Inc. of Norwood, Mass. Accordingly, the 3-1 multiplexer 24 forwards either one or more of the electrode voltages X+, X−, Y+, or Y− as the reference voltage, or a high rail voltage (Vref) and ground (Gnd) as the reference voltage. The choice of reference voltage is stored in an internal register (not shown), which selects from single end mode and ratiometric mode.

Figure 4:
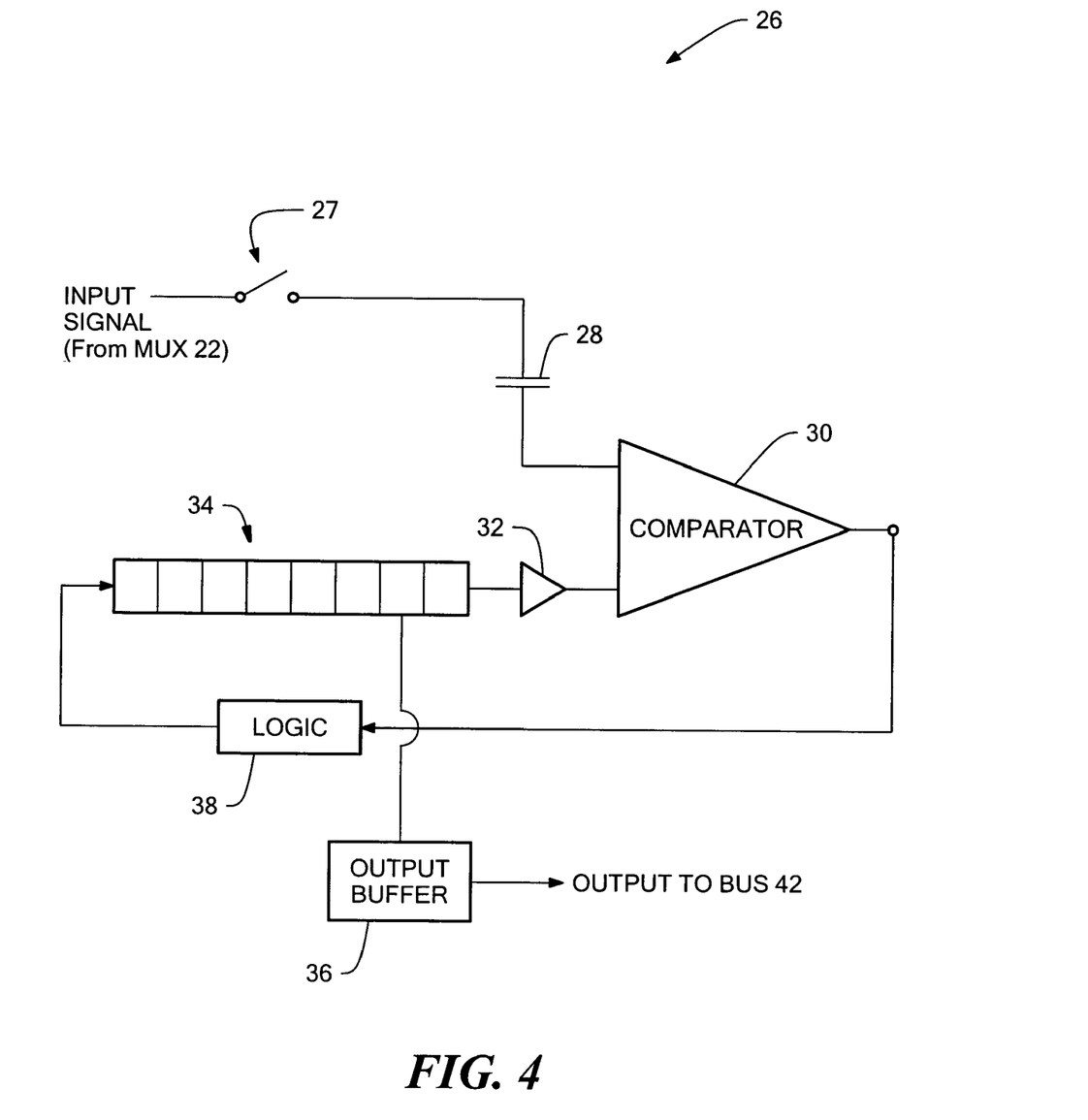
FIG. 4 schematically shows a simplified electrical drawing of the analog-to-digital converter FIG. 5 schematically shows a disable module that controls the analog-to-digital converter shown in FIG. 3.

FIG. 4 schematically shows a simplified electrical drawing of the analog-to-digital converter 26. The converter 26 has a switch 27 that switches on and off in a controlled manner to store small segments of an input analog signal in a capacitive element 28. The capacitive element 28 in turn is coupled with one of two inputs to a comparator 30. The other comparator input is coupled with a digital-to-analog converter 32 ("DAC") that converts a digital value within a twelve bit, internal approximation register 34 to an analog value. The approximation register 34 also is coupled with an output buffer 36 to deliver the output digital values to the converter output. Logic (schematically shown as logic block 38) within the analog-to-digital converter 26 controls the noted components to carry out the digitizing process. Details of the operation of the analog-to-digital converter 26 are discussed below with regard to FIGS. 6 and 7.

It should be noted that although illustrative embodiments are discussed as being used with a track and hold SAR analog-to-digital converter, any known analog-to-digital converter that can be adapted for the disclosed purposes can be used. Accordingly, discussion of a track and hold SAR analog-to-digital converter is exemplary and not intended to limit the scope of the invention.

Returning to FIG. 3, the analog-to-digital converter output delivers digitized data to a register 40 via a system bus 42. A microprocessor 44 then retrieves the data from this register 40 to calculate the actual coordinate information in accordance with conventional processes. The underlying system using the touch screen system 10 then uses this coordinate information to continue its underlying function. For example, if the underlying system is an ATM machine, then internal intelligence (in conjunction with the controller 18) can determine which button appearing on the screen 16 was selected by a user. The underlying system then can respond accordingly, such as by dispensing cash from the user's checking account.

In addition to the above components, the system 10 also has a disable module 46 that monitors the interference signal and selectively enables the analog-to-digital converter 26 based upon the timing of the interference signal. When enabled, the analog-to-digital converter 26 converts input analog signals into digital signals. When disabled, the analog-to-digital converter 26 merely tracks the input analog signals but does not convert them. In more simplistic terms, when enabled, the analog-to-digital converter 26 digitizes. When disabled, the analog-to-digital converter 26 does not digitize.

The disable module 46 may be either internal or external to the analog-to-digital converter 26. When internal, the analog-to-digital converter 26 has a designated pin that directly connects with the disable module 46. When external, the disable module 46 may be coupled with an enable or disable pin on the analog-to-digital converter 26.

Figure 5:
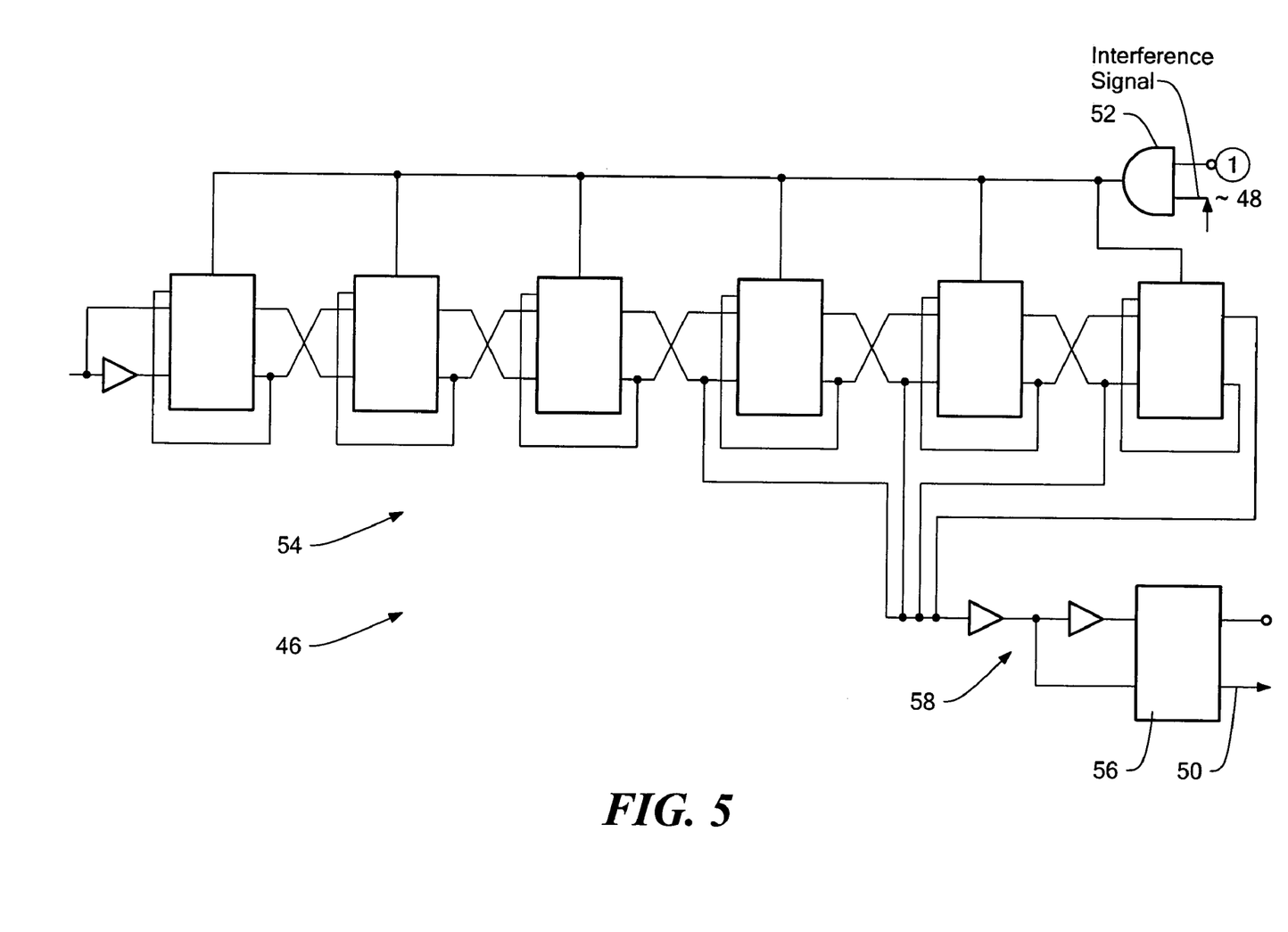

FIG. 5 schematically shows the disable module 46 configured in accordance with one embodiment of the invention. The disable module 46 has an input ("disable module input 48") to receive the interference signal, an output ("disable module output 50") coupled with the analog-to-digital converter 26 to either enable or disable the conversion stage, and digital circuitry to produce the intended result. The digital circuitry includes an AND gate 52 having the above noted disable module input 48, and another input set to logical one. The output of the AND gate 52 is coupled with six serial flip-flop circuits 54 that control a final flip-flop 56 via a pair of inverters 58. The output of the final flip-flop 56 is the above noted disable module output 50.

Accordingly, when the interference signal is logical zero, the output of the AND gate is logical zero. This effectively resets all of the flip-flops 56 and 58, consequently causing the disable module 46 to have no effect on the analog-to-digital converter 26. The conversion stage thus is unaffected. Conversely, when the interference signal is logical one, the output of the AND gate is logical one. This causes the flip-flops 56 to begin counting, causing a delay in the conversion stage.

It should be noted that although it is shown as being implemented with digital circuitry, the disable module 46 may be implemented in any manner known in the art, such as with software, or a combination of hardware and software. Accordingly, discussion of the disable module circuit shown in FIG. 5 is exemplary and not intended to limit the scope of the invention.

Figure 6:
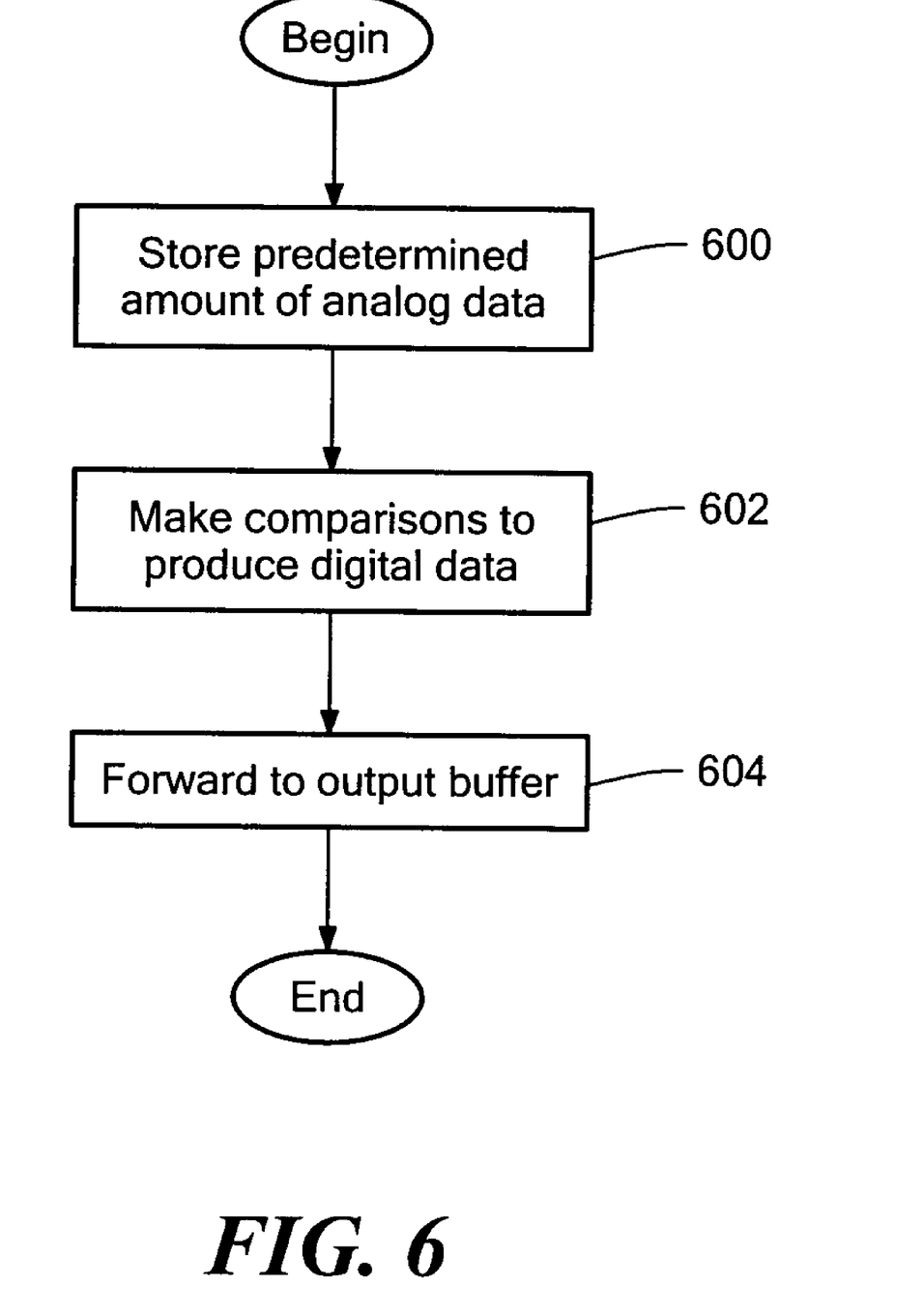
FIG. 6 shows a conventional method of converting data with a track and hold successive approximation register analog-to-digital converter.

FIG. 6 shows a conventional process of converting data with the track and hold SAR analog-to-digital converter 26 shown in FIGS. 3 and 4. This process is discussed simply to facilitate understanding of the more specific process discussed in FIG. 7.

The process of FIG. 6 begins at step 600, in which a predetermined amount of the input analog signal (e.g., 100 nanoseconds) is stored in the capacitive element 28 within the analog-to-digital converter 26 (FIG. 4). To that end, the switch 27 is controlled to switch in a manner that enables the predetermined amount of the input analog signal to be stored in the capacitive element 28. The other comparator input receives an analog voltage from the approximation register 34. At this point in the digitizing process, the predetermined amount of the input analog signal is considered to have been acquired. Accordingly, this portion of the process is considered to be the "acquisition stage." Of course, in embodiments using other types of analog-to-digital converters, acquisition may be some other process of acquiring the input analog signal.

The process then continues to step 602, in which the acquired portion of the input analog signal is considered to be converted from analog form to digital form. This portion of the process is referred to herein as the "conversion stage." Specifically, the comparator 30 makes a series of comparisons between the two inputs to produce the resultant digital data. To that end, the approximation register 34 initially is set to logical 0. During a first cycle, the logic 38 sets the most significant bit of the approximation register 34 to logical 1, while the remaining bits remain at logical 0. This effectively sets the approximation register 34 to one-half of its maximum possible output value. The digital-to-analog converter 32 then converts that value to an analog value, which is compared (by the comparator 30) to the analog input waveform stored in the capacitive element 28. It then is determined if the value of the analog input waveform is smaller than the value of the approximation register 34.

If the analog input waveform is smaller, then the logic 38 toggles the most significant bit to logical 0; otherwise it remains at logical 1. Next, the logic 38 sets the second most significant bit to logical 1. The remaining less significant bits remain set to logical 0. The process of converting the approximation register value to an analog value and comparing the converted value to the analog input waveform then is repeated. Again, the logic 38 determines if the analog input waveform is smaller than the value of the approximation register 34 (now with two bits set). If the analog value is smaller, then the second most significant bit toggles to logical 0; otherwise, it remains at logical 1. This process continues for the remaining bits of the approximation register 34.

After this process in step 602 fully iterates for all bits of the approximation register 34, the process continues to step 604, in which the resultant digital value within the approximation register 34 is made available to the output buffer 36 until a new sample value is calculated. At that time, the value in the approximation register 34 will no longer be valid and, eventually, will be overwritten for the next predetermined amount of the input analog signal. This process repeats to digitize the entire input analog signal.

This process of FIG. 6 repeats in a substantially uninterrupted fashion until the disable module 46 (FIG. 3) detects that the interference signal has been asserted (i.e., it is "on" or logical 1). At that point, the disable module 46 interrupts processing and begins the process shown in FIG. 7. The process in FIG. 7 begins at step 700, in which the interference signal is detected to be in an "on" state. Among other ways, the disable module 46 may detect the interference signal through an input port (e.g., an input pin) that is electrically connected to the display device 12. In some embodiments, the disable module 46 has another way of detecting the interference signal. For example, the disable module 46 may detect the interference signal by sensing a specific amount of jitter in the input analog signal. In either case, the interfering signal is considered to be received via some input.

It then is determined at step 702 if any uncompleted conversions remain in the conversion stage. Specifically, if, at this time, the process of FIG. 6 is executing step 602 by making comparisons to produce digital data, then the process of FIG. 7 continues to step 704, in which the disable module 46 permits the remaining conversions to be completed and forwarded to the output buffer. It should be noted that in illustrative embodiments, the analog data being converted during this step has not been corrupted by the interference signal.

Figure 7:
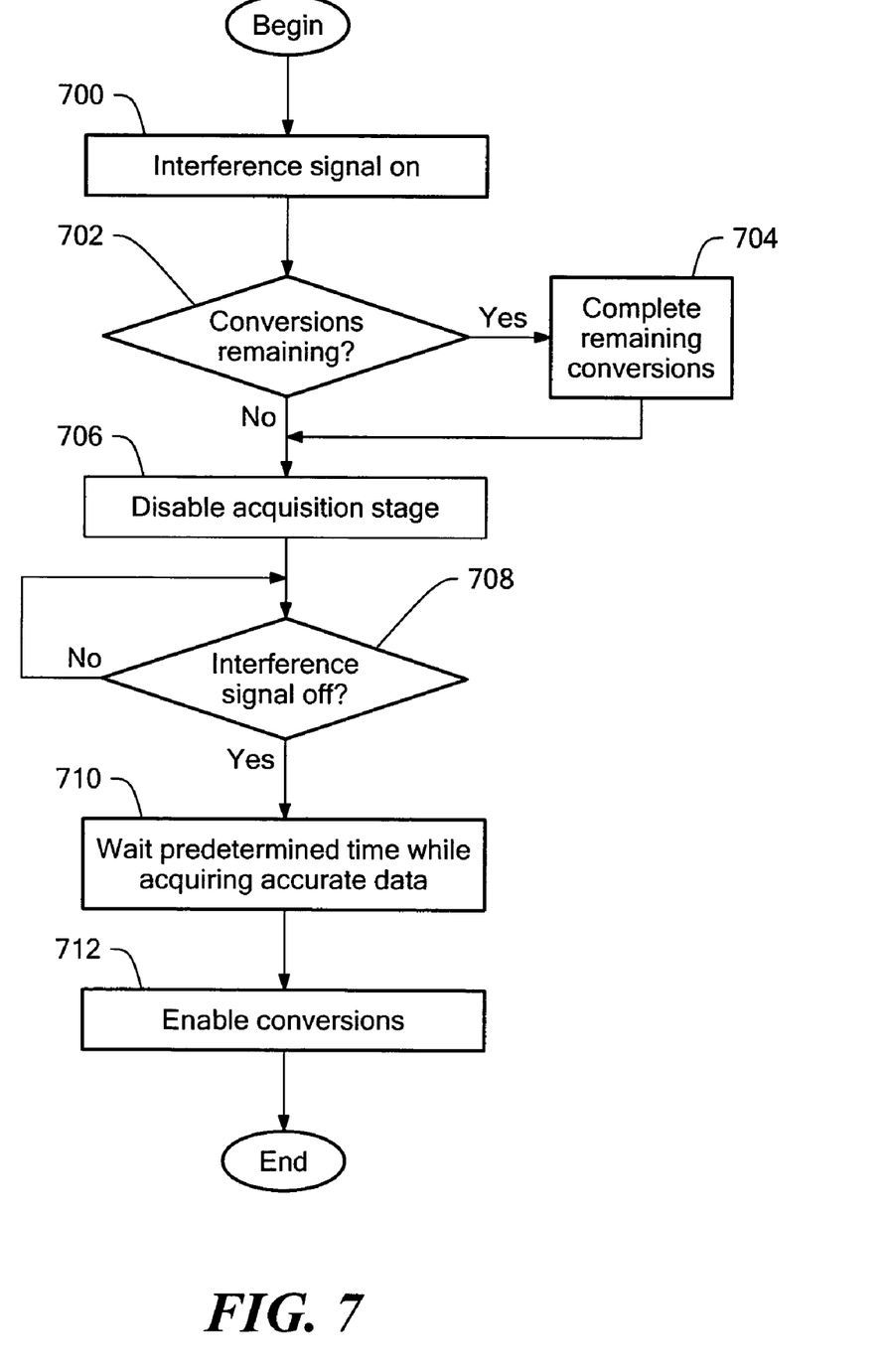
FIG. 7 shows a method of controlling the analog-to-digital converter shown in FIG. 3 in accordance with illustrative embodiments of the invention.

There may be other times when the conversion stage continues to process for some time after the interference signal is asserted. For example, if a complete portion of the input analog signal has been fully stored in the capacitive element 28 but its conversion has not begun, then the controller 18 will be permitted to convert that stored value. In such case, the process continues to step 706 after conversion is complete.

Returning to step 702, if no conversions are remaining, then the process continues to step 706, in which the acquisition stage is disabled. To that end, the switch 27 in the converter 26 is set to an open state, thus preventing the input signal from being stored in the capacitive element 28. Accordingly, no new data will be stored and, consequently, converted by the conversion stage. Setting the switch 27 in this manner effectively prevents both stages from digitizing. The analog-to-digital converter 26 therefore cannot digitize data when this happens.

This continues until the interference signal turns to an "off" state (step 708). At that time, the disable module 46 may delay switching the switch 27 to a closed state for a predetermined time to ensure that the data in the capacitive element 28 is not corrupted by the interference signal (step 710). This predetermined time may be based upon the type of interference signal (e.g., zero time to some other value). After the switch 27 closes, a new portion of the input signal is stored in the capacitive element 28, thus permitting the conversion stage to begin converting a new analog value. Accordingly, at this point in the process, the analog-to-digital converter 26 may continue operating as discussed above in FIG. 6.

In alternative embodiments, the touch control system 10 digitizes other types of input analog signals in a manner that is consistent with those discussed above. For example, rather than representing the coordinates of point of contact, the input analog signal may represent the pressure applied to the touch screen 16.

Illustrative embodiments of the invention thus minimize the adverse impact of interference signals produced by the underlying display device 12. Accordingly, touch screen display systems (and their accompanying analog-to-digital converters) should operate more efficiently and with a lower error rate.

As noted above, various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as preprogrammed hardware elements (e.g., application specific integrated circuits, FPGAs, and digital signal processors), or other related components.

Embodiments of the invention thus may be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g.; a computer program product) and hardware. Still other embodiments of the invention are implemented as entirely hardware, or entirely software (e.g., a computer program product).

Although various exemplary embodiments of the invention are disclosed below, it should be apparent to those skilled in the art that various changes and modifications can be made that will achieve some of the advantages of the invention without departing from the true scope of the invention.

What is claimed is:

1. A touch screen controller for use with a touch screen device, the touch screen controller comprising:
 a set of inputs for receiving an interference signal from the touch screen device,
 the set of inputs also receiving analog data from the touch screen device; and
 a converter operatively coupled with the set of inputs,
 the converter having a disable module that monitors the interference signal and enables and disables the converter based upon the timing of the interference signal, the set of inputs receiving the analog data when the converter is disabled, the converter tracking the analog data when disabled, the converter not converting the tracked analog data when disabled.

2. The touch screen controller as defined by claim 1 further including a delay module for preventing the converter from digitizing for a selected delay period after the beginning of the off cycle of the interference signal.

3. The touch screen controller as defined by claim 1 wherein the converter has an acquisition stage for acquiring the analog data, the converter also having a conversion stage for digitizing the acquired analog data, the converter being capable of digitizing given acquired data received during the on cycle of the interference signal, the given acquired data having been acquired during the off cycle of the interference signal.

4. The touch screen controller as defined by claim 1 wherein the converter has a acquisition stage for acquiring the analog data, and a conversion stage for digitizing the acquired analog data, the conversion stage being prevented from digitizing at some time during the on cycle of the interference signal.

5. The touch screen controller as defined by claim 1 wherein the converter has a acquisition stage for acquiring the analog data, and a conversion stage for digitizing the acquired analog data, the acquisition stage is disabled as a function of the interference signal.

6. The touch screen controller as defined by claim 1 wherein the interference signal is capable of distorting the data received from the touch screen device, the interference signal being a display device refresh signal.

7. The touch screen controller as defined by claim 1 wherein the touch screen device includes one of a liquid crystal display device and a cathode ray tube display device.

8. A controller for controlling an analog-to-digital converter, the controller comprising: an input for receiving an interference signal; logic operatively coupled with the input, the logic producing a control signal that is a function of the interference signal; and an output for forwarding the control signal to the analog-to-digital converter, the analog-to-digital converter digitizing analog signals as a function of the control signal; a converter operatively coupled with the set of inputs the converter having a disable module that monitors the interference signal and enables and disables the converter based upon the timing of interference signal, the set of inputs receiving the analog data when the converter is disabled, the converter tracking the analog data when disabled, the converter not converting the tracked analog data when disabled.

9. The controller as defined by claim 8 wherein the controller includes an internal analog-to-digital converter, the output being coupled with the internal analog-to-digital converter, the control signal controlling the internal analog-to-digital converter.

10. The controller as defined by claim 9 further including means for preventing the internal analog-to-digital converter from digitizing for a selected delay period after the beginning of an off cycle of the interference signal.

11. The controller as defined by claim 9 wherein the internal analog-to-digital converter is a successive approximation register analog-to-digital converter.

12. The controller as defined by claim 9 wherein the interference signal has an on cycle and an off cycle, the control signal preventing the internal analog-to-digital converter from digitizing at some time during the on cycle of the interference signal.

13. A touch screen system comprising:
 a display device having at least one touch sensitive sheet that, when driven, generates analog data in response to contact;
 a set of inputs for receiving an interference signal from the touch screen device, the set of inputs also receiving the analog data from the touch screen device; and
 a converter operatively coupled with the set of inputs, the converter having a disable module that monitors the interference signal and enables and disables the converter based upon the timing of the interference signal, the display device being driven to generate the analog data when the converter is disabled.

14. The touch screen system as defined by claim 13 further including a processing module operatively coupled with the converter, the processing module capable of converting data received from the touch screen controller into position information.

15. The touch screen controller as defined by claim 13 wherein the interference signal has an off cycle and an on cycle, the disable module capable of preventing the converter from digitizing at some time during the on cycle of the interference signal.

16. The touch screen controller as defined by claim 15 wherein the converter has a acquisition stage for acquiring the analog data, and a conversion stage for digitizing the acquired analog data, the conversion stage being prevented from digitizing at some time during the on cycle of the interference signal.

17. The touch screen controller as defined by claim 13 wherein the interference signal is capable of distorting the data received from the display device, the interference signal being a display device refresh signal.

18. The touch screen controller as defined by claim 13 wherein the display device includes one of a liquid crystal display device and a cathode ray tube display device, the display device having resistive sheets to produce a resistive touch display device.

* * * * *